(12) United States Patent
Yang et al.

(10) Patent No.: US 9,442,375 B2
(45) Date of Patent: Sep. 13, 2016

(54) SUPEROLEOPHOBIC SURFACES AND METHODS OF MAKING SAME

(71) Applicants: The University of Western Ontario, London (CA); LANXESS Butyl Pte. Ltd., Singapore (SG)

(72) Inventors: Jun Yang, London (CA); Tingjie Li, London (CA); Maxim Paliy, London (CA); Xiaolong Wang, London (CA); Natalie Suhan, London (CA)

(73) Assignees: ARLANXEO Singapore PTE LTD., Sihgapore (SG); The University of Western Ontario, London (CA)

( * ) Notice: Subject to any disclaimer, the term of this patent is extended or adjusted under 35 U.S.C. 154(b) by 0 days.

(21) Appl. No.: 14/408,427

(22) PCT Filed: Jun. 18, 2013

(86) PCT No.: PCT/CA2013/000583
§ 371 (c)(1),
(2) Date: Dec. 16, 2014

(87) PCT Pub. No.: WO2013/188958
PCT Pub. Date: Dec. 27, 2013

(65) Prior Publication Data
US 2015/0153642 A1 Jun. 4, 2015

Related U.S. Application Data

(60) Provisional application No. 61/661,035, filed on Jun. 18, 2012.

(51) Int. Cl.
| | |
|---|---|
| *B81B 1/00* | (2006.01) |
| *G03F 7/00* | (2006.01) |
| *B81C 1/00* | (2006.01) |
| *G03F 7/004* | (2006.01) |
| *G03F 7/20* | (2006.01) |
| *B08B 17/06* | (2006.01) |
| *B82Y 30/00* | (2011.01) |

(52) U.S. Cl.
CPC ......... *G03F 7/0037* (2013.01); *B81C 1/00031* (2013.01); *B81C 1/00206* (2013.01); *G03F 7/004* (2013.01); *B08B 17/065* (2013.01); *B81B 2203/0361* (2013.01); *B82Y 30/00* (2013.01); *C03C 2217/76* (2013.01); *G03F 7/2024* (2013.01); *Y10T 428/24372* (2015.01); *Y10T 428/24405* (2015.01)

(58) Field of Classification Search
CPC .... G03F 7/0037; G03F 7/004; G03F 7/2024; G03F 7/2012; B82Y 30/00; B81C 1/00031; B81C 1/00026; C08J 7/047; C08J 7/12; Y20T 428/24372; Y20T 428/24405; B81B 2203/0361; B05D 5/08; B08B 17/065; C03C 2217/76
USPC .............. 430/11, 18; 428/141, 143, 147; 977/707, 773, 892, 897, 901, 902
See application file for complete search history.

(56) References Cited

U.S. PATENT DOCUMENTS

| | | | |
|---|---|---|---|
| 4,882,245 A | 11/1989 | Gelorme et al. | |
| 2010/0304086 A1* | 12/2010 | Carre | B82Y 20/00 428/149 |
| 2010/0316842 A1 | 12/2010 | Tuteja et al. | |
| 2014/0011013 A1 | 1/2014 | Jin et al. | |

FOREIGN PATENT DOCUMENTS

| | | | |
|---|---|---|---|
| WO | WO 2010/022107 A2 * | 2/2010 | |
| WO | WO 2012/118805 A2 * | 9/2012 | |

OTHER PUBLICATIONS

Steele, Adam, et al., "Conformal ZnO nanocomposite coatings on micro-patterned surfaces for superhydrophobicity", Thin Solid Films vol. 518, No. 19, 2010, Elsevier-Squoia S.A., Lausanne, Switzerland, pp. 5426-5431.
Hong, Lingfei, et al. "Surface Microfluidics Fabricated by Superhydrophobic nanocomposite Photoresist", MEMS, 2010, IEEE 23rd International Conference, Piscataway, NJ, 2010, pp. 420-423.
International Search Report from International Application No. PCT/CA2013/000583, Sep. 4, 2013, two pages.
Supplementary European Search Report from European Application No. EP13807555, Jun. 26, 2015, two pages.

* cited by examiner

*Primary Examiner* — John A McPherson

(57) ABSTRACT

Disclosed herein is a substrate having a surface modified to impart multi-scale roughness, thereby providing superhydrophobic and/or superoleophobic properties. The surface comprises a pattern of microscale pillars topped by a plurality of nanoparticles having a re-entrant convex shape. The area fraction of the surface is also selected to provide the desired superoleophobic properties. Also disclosed herein is a process for creating the modified surface comprising photolithography, optionally followed by vapor deposition. The substrates may be formed into useful articles or applied to pre-formed articles.

14 Claims, 9 Drawing Sheets

SUPEROLEOPHOBIC SURFACES AND METHODS OF MAKING SAME

FIELD

Disclosed herein are substrates having a surface morphology that is modified to impart desirable oleophobic or superoleophobic properties to the surface. The surface morphology may comprise microscale pillars topped with nanoparticles that may be nearly spherical. Also disclosed is a photolithographic method for modifying substrate surfaces in order to create the desirable surface morphology, which may be combined with vapor deposition.

BACKGROUND

Attempts have been made to modify substrate surfaces in order to impart desirable characteristics. For example, it has been observed that superoleophobicity occurs on structures having a multiscale roughness and re-entrant/overhanging features. However, there is a need for superoleophobic surfaces having greater contact angles for organic liquids. There is a need for a simplified process for creating superoleophobic surfaces, particularly processes with a reduced number of steps. There is a need for a simplified process for creating surfaces with multiscale roughness, particularly surfaces exhibiting a re-entrant convex morphology. In addition, the number of substrate surfaces on which these surface morphologies can be created has been limited. There is a need for superoleophobic surfaces on a variety of substrates, for example organic substrates, such as elastomers.

SUMMARY

There is provided herein an article comprising a substrate having a surface comprising a pattern of microscale pillars topped with a plurality of nanoparticles, wherein the surface has a contact angle for water of greater than 150°. The surface may additionally or alternatively have a contact angle for hexadecane of greater than 150°. The pattern may comprise an array, for example a regularly spaced array, such as a rectangular array. The substrate may comprise silicon, glass, metal or a polymer, for example an elastomer, such as butyl rubber. The microscale pillars and/or nanoparticles may comprise a photoresist, for example a negative photoresist, such as a combination of an epoxy resin, organic solvent and cationic photoinitiator of a type similar to the commercially available material known as SU-8. The pillars and nanoparticles may be made from the same type of photoresist or different photoresists. The pillars and nanoparticles may be crosslinked to one another. The pillars and nanoparticles may have a surface coating comprising a fluorinated hydrocarbon, for example a fluorinated polymer or a fluorosilane material. The fluorinated hydrocarbon may be present on the pillars, the nanoparticles, or substantially the entire modified surface of the substrate. The surface may have a multi-scale or hierarchical morphology. The plurality of nanoparticles may together create a re-entrant convex morphology atop at least a plurality of the pillars or atop each pillar. The area fraction, f, of the surface may range from 0.01 to 0.10. The surface may have a contact angle for hexadecane of from 151° to 179°. The substrate may be applied to the article, for example as a paint or coating.

There is also provided herein an article comprising a substrate having a surface comprising a pattern of microscale pillars topped with a plurality of nanoparticles, wherein the area fraction, f, of the surface is from 0.01 to 0.10. The surface may have a multi-scale or hierarchical morphology, for example caused by micrometer scale pillars topped with nanometer scale particles. The particles may together create a re-entrant and/or convex morphology. The surface may comprise a regular pattern of microscale pillars, for example an array of pillars. The surface may have a contact angle for water of greater than 150° and/or a contact angle for hexadecane of greater than 150°. A plurality of the pillars may be topped with a plurality of nanoparticles. The pillars and nanoparticles may be made from a negative photoresist and optionally crosslinked together. At least the nanoparticles and optionally the pillars or the substantially the entire modified substrate surface may be coated with a fluorinated hydrocarbon, for example a fluorosilane material. The area fraction, f, of the surface may range from 0.02 to 0.09, from 0.03 to 0.08, from 0.04 to 0.07, or from 0.05 to 0.06. The substrate may be applied to the article, for example as a paint or coating.

There is also provided herein a process for the modification of a substrate surface comprising: creating a pattern of microscale pillars on the substrate surface using photolithography; and, providing the microscale pillars with a re-entrant morphology. The step of providing the microscale pillars with a re-entrant morphology may comprise photolithography. Thus, there is also provided herein a process for the modification of a substrate surface comprising: creating a pattern of microscale pillars on the substrate surface using photolithography; and, topping the pillars with a plurality of nanoparticles using photolithography.

The step of creating a pattern of microscale pillars may comprise: applying a photoresist to the substrate; and, exposing the photoresist to a pattern of ultraviolet light. The nanoparticles may be cross linked to the pillars and/or may be made using a negative photoresist. The pillars may also be made using a negative photoresist. The pillars and nanoparticles may both be made from the same negative photoresist. The negative photoresist may comprise an epoxy resin, an organic solvent, and a cationic photoinitiator.

The process may further comprise polymerizing a portion of the photoresist to create the micropillars. The polymerization may take place at a temperature of from 50 to 100° C. for a time of from 1 to 5 minutes.

The process may further comprise: removing some of a remaining non-polymerized portion of the photoresist such that there is residual photoresist; and, exposing the residual photoresist to ultraviolet light. The removing step may comprise washing with a developer suitable for removing the negative photoresist for a pre-determined time period. The developer may comprise 1-Methoxy-2-propyl acetate. The pre-determined time period may be selected in order to leave residual (uncrosslinked) photoresist on the pillars and may be from 45 to 75 seconds.

The removing step may be followed by washing with an alcohol, for example isopropyl alcohol, optionally followed by washing with water. The residual photoresist then nucleates within the alcohol, for example atop the pillars. Subsequently exposing the residual photoresist to ultraviolet light causes nanoparticles to form atop the pillars. These nanoparticles may together exhibit a re-entrant and optionally convex morphology atop the pillars.

The process may further comprise pre-treating the substrate with hexamethyl disilazane (HMDS) prior to applying the photoresist.

The substrate may be pre-treated by applying a layer of photoresist to the substrate and exposing substantially the entire substrate to ultraviolet light, prior to exposing the photoresist to the pattern of ultraviolet light. In this case, the substrate may comprise an elastomer, for example a rubber, such as butyl rubber. Alternatively, the substrate may comprise silicon, glass or metal.

The process may further comprise applying a fluorinated hydrocarbon to at least the nanoparticles and/or to substantially the entire modified surface of the substrate. The fluorinated hydrocarbon may be applied by vapour deposition, for example by evaporating a solution of the fluorinated hydrocarbon at elevated temperature in the presence of the nanoparticles. The fluorinated hydrocarbon may comprise a fluorosilane.

The above may provide a number of desirable features and advantages over the prior art. The contact angle for hexadecane may be increased to greater than 150°, for example in the range of from 151° to 179°, 155° to 175° or 160° to 170°. This desirable contact angle may be provided on organic substrates, especially rubber substrates, for example butyl rubber substrates. A contact angle may be provided for water of greater than 150°, especially on polymeric substrates, for example elastomers. The number of steps required to produce surfaces having modified morphology, especially surfaces exhibiting superoleophobic properties, may be reduced. A process comprising a unified or single photolithographic step may be provided for creating a regular array of micropillars on the substrate surface. The development step of photolithography process may nucleate nanoparticles on the top of the pillars, thereby resulting in a surface with multiscale roughness and a re-entrant convex surface morphology in a reduced number of processing steps. The photolithography process may be advantageously combined with vapour deposition process using a fluorosilane material. This can advantageously provide a simplified production process that may be amenable to commercial scale production, reduced cost and/or reduced environmental impact.

BRIEF DESCRIPTION OF THE DRAWINGS

Having summarized the invention, embodiments thereof will now be described with reference to the accompanying figures, in which.

DETAILED DESCRIPTION

Figure 1:
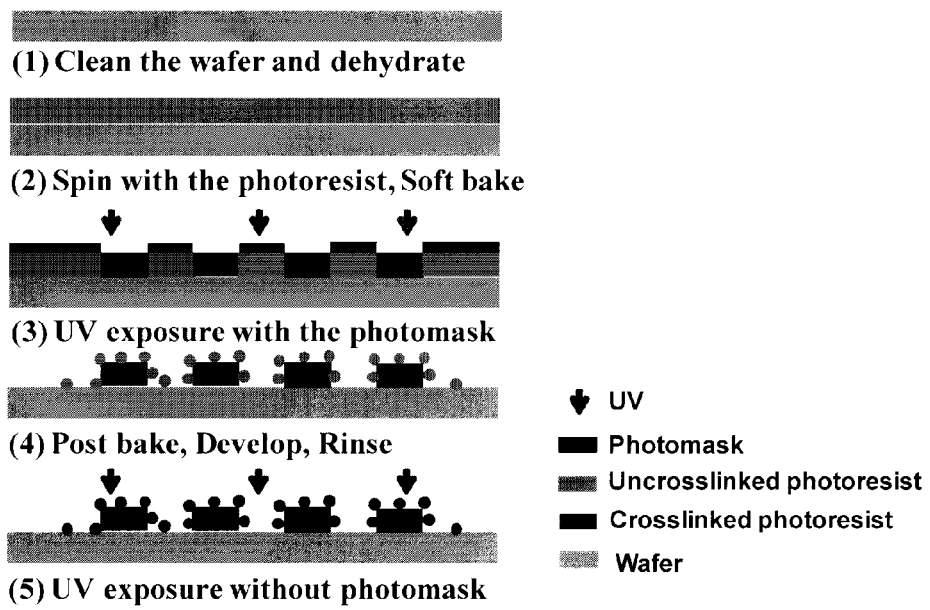
FIG. 1 shows a schematic of a photolithography process for the fabrication of micro-/nano-scale hierarchical structures on regular surfaces.

Measuring the contact angle θ (CA) is one way to characterize wetting of surfaces. The CA is affected both by the chemical nature of the surface and by its roughness. Affinity of a flat surface towards a certain liquid is defined in terms of the "flat" (or intrinsic, or Young's) contact angle, $$\cos(\theta_{flat}) = \frac{\gamma_{SA} - \gamma_{SL}}{\gamma_{LA}}, \qquad (1)$$

where γ is the surface energy (or surface tension), subscript S stands for solid, L for liquid and A for air. The solid-liquid surface energy can be estimated via the other two as follows:

$$\gamma_{SL} = \gamma_{SA} + \gamma_{LA} - 2\sqrt{\gamma_{SA}\gamma_{LA}} \qquad (2)$$

The surface is called (hydro-, oleo-, etc.) -phobic if θ>90°, and -philic otherwise. For water (surface energy $\gamma_{LA}$=73 mJ m$^{-2}$) the best non-wetting situation on a flat surface is achieved if it is terminated with —CF$_3$ groups, which brings its surface energy down to $S_A$~6 mJ m$^{-2}$. The value of intrinsic (Young's) contact angle for water on such a surface is $\theta_{flat}$~120° [which is close to the estimation via the Eqs. (1) and (2)]. By contrast, most oils have very low surface energies (e.g. $\gamma_{LA}$=27.6 mJ m$^{-2}$ for hexadecane, $\gamma_{LA}$=23.8 mJ m$^{-2}$ for decane). Consequently, even on the chemically least energetic —CF$_3$ terminated surface, the intrinsic (Young's) contact angle for a typical oil such as hexadecane is $\theta_{flat}$~78°. In other words, flat surfaces are intrinsically oleophilic, according to Young's contact angle, no matter what the chemical nature is of the flat surface. This circumstance has profound consequences on the design of superoleophobic surfaces.

The term "superhydrophobic" as used herein comprises surfaces having a contact angle for water of greater than 150°.

The term "superoleophobic" as used herein comprises surfaces having a contact angle for an organic liquid of greater than 150°. Such organic liquids may comprise hydrocarbon liquids having a surface energy $\gamma_{LA}$<30 mJ m$^{-2}$. Such liquid hydrocarbons may be characterized as hydrophobic and may be liquid at ambient temperature and pressure. Such liquids may comprise aliphatic hydrocarbons having from 6 to 14 carbon atoms, for example octane, decane or hexadecane. A preferred organic liquid for the purposes of defining superoleophobicity herein is hexadecane.

The term "substrate" as used herein comprises a material having a surface amenable to modification in order to impart desired superoleophobic properties. Preferred substrates are those having surfaces amenable to modification using the photolithographic processes described herein. Suitable substrates may be organic or inorganic. Examples of suitable substrates may include silicon, glass, metal or polymer materials. The metal materials may comprise tri-valent or penta-valent metals, such as aluminum or gold. The polymer materials may comprise an elastomer or a rubber. The rubber may comprise styrene-butadiene, polybutadiene, ethylene-propylene diene monomer (EPDM), nitrile or butyl rubber.

The term "butyl rubber" as used herein comprises a copolymer of an isoolefin monomer and a multiolefin monomer, optionally in the presence of further copolymerizable monomers. The copolymer may be substituted with one or more functional groups and may be halogenated. Examples of suitable isoolefin monomers include isoolefins within the range of from 4 to 16 carbon atoms, preferably 4-7 carbon atoms, such as isobutene, 2-methyl-1-butene, 3-methyl-1-butene, 2-methyl-2-butene, 4-methyl-1-pentene and mixtures thereof. Isobutene is one example of a preferred isoolefin. Suitable multiolefin monomers may comprise conjugated diene monomers having in the range of from 4-14 carbon atoms, for example isoprene, butadiene, 2-methylbutadiene, 2,4-dimethylbutadiene, piperyline, 3-methyl-1,3-pentadiene, 2,4-hexadiene, 2-neopentylbutadiene, 2-methyl-1,5-hexadiene, 2,5-dimethyl-2,4-hexadiene, 2-methyl-1,4-pentadiene, 2-methyl-1,6-heptadiene, cyclopenta-diene, methylcyclopentadiene, cyclohexadiene, 1-vinyl-cyclohexadiene and mixtures thereof. Isoprene is one example of a preferred conjugated diene. Suitable multiolefin monomers may also comprise cyclopentadiene, methylcyclopentadiene and/or styrenic monomers, for example styrene, chlorostyrene, alpha-methyl styrene or para-methyl styrene. The term "butyl rubber" may also include, for example, random copolymers of isobutylene, isoprene and para-methylstryene. Commercially available butyl rubbers are provided by LANXESS Inc. under the tradenames RB-301™, RB-401™, BB-2030™, etc.

The term "microscale" as used herein comprises a surface having a measurable feature in the range of from 1 to 999 µm.

The term "nanoscale" as used herein comprises a surface having a measurable feature in the range of from 1 to 999 nm.

The term "multiscale" as used herein comprises a surface having two or more measurable features, at least one of which is microscale and at least one of which is nanoscale.

The term "pillar" as used herein comprises a measurable surface feature having an aspect ratio of height to narrowest width (or diameter) of greater than 1, greater than 1.5, greater than 2, greater than 3, greater than 4, greater than 5, greater than 10, greater than 15, greater than 20 or in the range of from 1 to 20, 1.5 to 18 or 2 to 15. Pillars may be square, rectangular or cylindrical in cross-sectional shape and may have a uniform cross-sectional shape along at least a portion of their height.

The term "re-entrant" as used herein comprises a surface feature that has a first portion with a first width and a second portion with a second width, the first width greater than the second width. One example of a re-entrant surface feature is provided by a plurality of nanoparticles aggregated atop a micropillar such that a composite top is formed having a diameter larger than that of the pillar. Re-entrant features preferably have a convex upper surface. Re-entrant surface features may resemble "mushroom caps", "bean sprouts", "hoodoos", or a variety of other similar commonly known shapes when seen in side view.

The term "nanoparticle" as used herein comprises a nanoscale deposit of a heterogeneous material. Nanoparticles may be regular or irregular in shape and may be formed from a plurality of co-deposited particles that form a composite nanoscale particle. Nanoparticles may be generally spherical in shape or have a composite shape formed from a plurality of co-deposited generally spherical particles. Suitable materials for formation of a nanoparticle may comprise negative photoresists that are initially uncrosslinked.

The term "fluorinated hydrocarbon" as used herein comprises a fluorine substituted hydrocarbon that may be aliphatic, aromatic or polymeric in nature and may additionally be substituted with other organic moieties. Examples of a fluorine substituent are —$CF_2H$, —$C_6F_5$, —$CF_2$ and —$CF_3$. Suitable fluorinated hydrocarbons may be those that are amenable to vapour deposition. An example of a suitable fluorinated hydrocarbon is a silane substituted fluorinated polymer, or fluorosilane, such as 1H,1H,2H,2H-perfluorooctyl-trichlorosilane, 1H,1H,2H,2H-perfluorodecyltrimethoxysilane, and 1H,1H,2H,2H-perfluorodecyltrichlorosilane.

The term "photolithography" as used herein comprises optical lithography techniques that use light to selectively remove material from or add material to a substrate. Photolithographic processes may comprise the application of a photoresist to the substrate. The photoresist may be a chemical that is sensitive to light of a particular wavelength being applied to the substrate. The photoresist may be a positive photoresist that reacts with the light and becomes soluble in the developer or a negative photoresist that reacts with the light to become crosslinked and insoluble in the developer. Negative photoresists suitable for use herein are those that polymerize upon exposure to ultraviolet light, for example epoxy based photoresists comprising an epoxy resin, an organic solvent, and a cationic photoinitiator, such as KMPR or SU-8, as described in U.S. Pat. No. 4,882,245, which is incorporated herein by reference. Persons of skill in the art are familiar with other epoxy based photoresists that function in a similar manner. A pattern may be created on the substrate by using a photomask to selectively block light from interacting with the photoresist in desired locations. In this manner, a desired pattern of polymerized material may be built on the surface of the substrate. A developer may be used to remove or wash away uncrosslinked or unpolymerized negative photoresist. The washing with developer may be conducted for a pre-determined time period selected in order to leave residual uncrosslinked or unpolymerized photoresist on the substrate. For example, the time period may be from 45 to 75 seconds for a specific thickness of photoresist layer and particular washing conditions. The time period may be abbreviated as compared with conventional photolithographic processes, which normally seek to remove all uncrosslinked photoresist. Photolithograhic processes may comprise multiple iterations in order to increase the size of the desired surface features. Further information on photolithographic techniques suitable for use with the present invention may be found in Marc J. Madou, Fundamentals of Microfabrication: The Science of Miniaturization, Second Edition, New York: CRC Press, 2002, which is incorporated herein by reference.

After developing, the process may further comprise washing the residual photoresist developer in an alcohol, for example a short chain alcohol or iso-alcohol, such as isopropanol. The washing step may serve to nucleate the uncrosslinked photoresist atop the micropillars. This step may optionally be followed by a further aqueous wash step to remove residual alcohol, for example with DI water. The sample may be exposed again to ultraviolet light without using the photomask, thereby crosslinking the residual photoresist nucleated atop the micropillars into nanoparticles that are optionally crosslinked also to the micropillars.

The term "vapour deposition" as used herein comprises physical or chemical vapour deposition. A preferred form of vapour deposition is molecular vapour deposition. Vapour deposition processes may employ a volatile solvent that acts as a carrier for the material to be deposited. The solvent may be removed by elevated temperature and/or reduced pressure. The elevated temperature may be greater than 50° C., greater than 60° C., or greater than 80° C. The elevated temperature may be in the range of from 50 to 120° C., 55 to 100° C., 60 to 90° C. or 65 to 85° C. Suitable materials for vapour deposition are those that do not decompose under process temperature and those that adhere in some fashion to the substrate. The material may adhere to the substrate or other materials adhered to the substrate by physical adsorption. The material may be a fluorinated molecule such as a fluorinated hydrocarbon that may physically adhere to or chemically react with the nanoparticles and/or micropillars.

The area fraction, f, of the surface may be important for providing desirable superoleophobic properties. It may be desirable to provide the substrate with an area fraction in the range of from 0.01 to 0.20, or from 0.01 to 0.15, or from 0.01 to 0.10, or from 0.05 to 0.10, or from 0.02 to 0.09, or from 0.03 to 0.08, or from 0.04 to 0.07, or from 0.05 to 0.06.

When rubber is used as a substrate, a larger dose of ultraviolet radiation may be required to initiate the cross-linking reaction than would be required for silicon substrates under otherwise identical conditions. In order to attenuate the ultraviolet light applied to the substrate surface, it may be desirable to apply a thin layer of negative photoresist prior to the photolithography process and exposing substantially the entire surface to a lower dosage of ultraviolet light. This polymerizes a layer of photoresist on the substrate in order to improve adhesion of subsequently formed features and also to protect the substrate from the higher doses of ultraviolet light required in subsequent stages of the process.

In order to further increase adhesion of the photoresist to the substrate, particularly when polymeric or rubber substrates are used, it may be desirable to pretreat the substrate with a hexamethyldisilazane (HMDS) prior to application of the photoresist.

In order to create superoleophobic surfaces at commercial scale, a variety of techniques can be used. One such technique employs large-area roll-to-roll and roll-to-plane nanolithography technology that is based on near-field optical lithography using cylindrically shaped rolling masks. Such techniques are described in, for example Ahn, S. H. and L. J. Guo, *Large-Area Roll-to-Roll and Roll-to-Plate Nanoimprint Lithography: A Step toward High-Throughput Application of Continuous Nanoimprinting.* ACS nano, 2009. 3(8): p. 2304-2310, which is incorporated herein by reference.

Substrates comprising the superoleophobic surface morphology may be formed into useful articles or applied to previously shaped articles in the form of a coating, overmold or the like. This imparts useful barrier properties to the article, such as resistance to penetration or attack by organic liquids, such as hydrocarbons, or the like. Other applications include fat and oil resistant coatings for articles in the medical device or pharmaceutical industry. Numerous other applications may be conceived by those skilled in the art.

EXAMPLES

Materials and Methods

Negative photoresist SU-8 (epoxy resin, cyclopentanone as organic solvent, triarylsulfonium salt as a cationic photoinitiator), negative photoresist KMPR (modified epoxy resin, cyclopentanone, triarylsulfonium, propylene carbonate) and SU-8 developer (1-Methoxy-2-propyl acetate) were purchased from MicroChem Corporation, Newton, Mass., USA. 1H,1H,2H,2H-perfluorooctyl-trichlorosilane (97%) was a product from Sigma-Aldrich. Piranha solution was made using $H_2O_2$ (30%) and $H_2SO_4$ (conc) solution in 3:7 vol/vol ratio. All of the chemicals were used as received. Patterns on photomasks were designed using the L-Edit software and then printed on chromium glasses with a high-resolution image-setting system (Nanofab, Alberta University). A spin coater (Solitec 5110 Spinner) and a mask aligner (Karl Suss MA6) were available in the Western Nanofabrication Lab at the University of Western Ontario. All processing solutions were prepared with the de-ionized (DI) water from a Milli-Q system (Millipore, Bedford, Mass.) filtered through 0.2 μm filters (Millipore).

Fabrication of Micro-/Nano-Scale Hierarchical Structures

Figure 2:
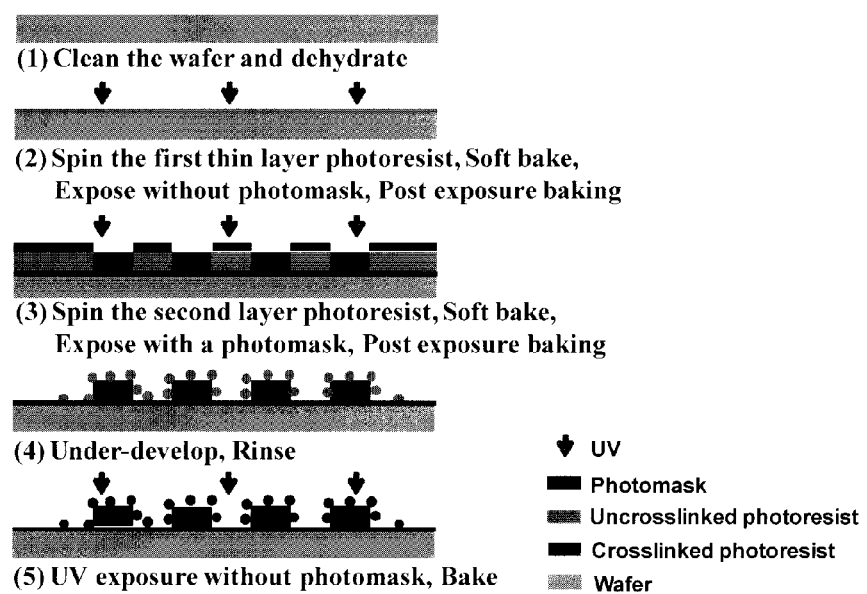
FIG. 2 shows a schematic of a photolithography process for the fabrication of micro-/nano-scale hierarchical structures on surfaces, which strongly absorb UV.
Figure 9:
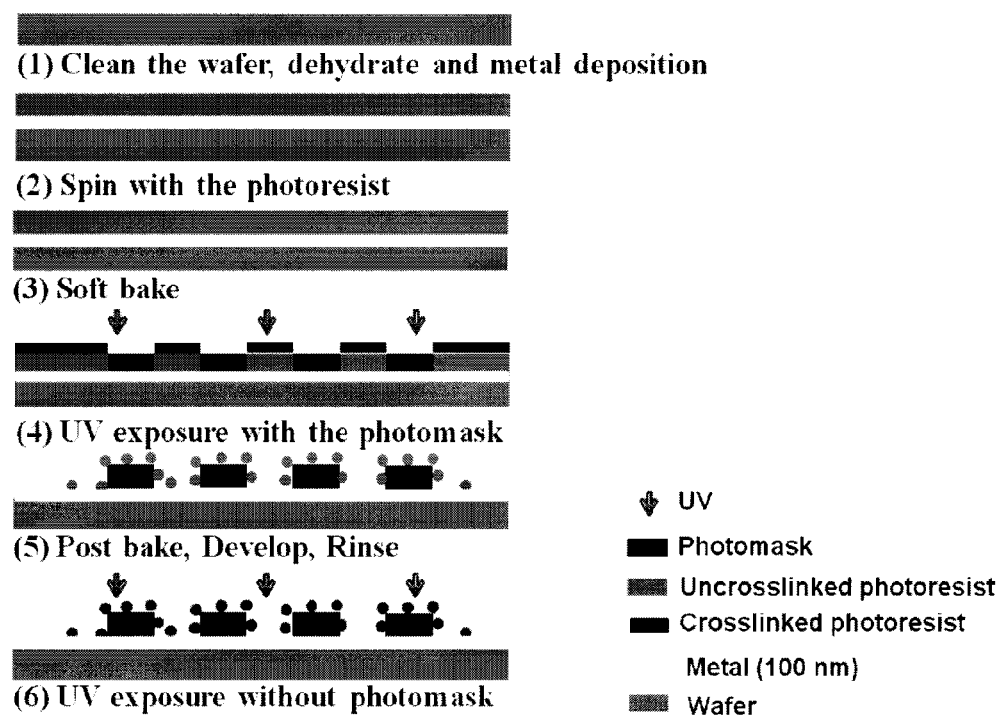

Referring to FIGS. 1, 2 and 9, the fabrication of a surface with multiscale structures was performed as follows. The substrates were first carefully cleaned in the piranha solution (80° C.) for 20 minutes, and dried at 100° C. for 5 minutes on a hotplate. The negative photoresist (SU-8 3010) was poured onto the substrates and spread using a spin coater at 500 rpm for 5 seconds followed by 1000 rpm for 30 seconds. Soft baking at 95° C. on hotplate was carried out for 10 minutes to remove the excess solvent from the SU-8 layer. Then the SU-8 layer was cross-linked via ultraviolet (UV) light exposure through a photomask using a mask aligner (sensor wavelength=365 nm, UV intensity 6 mW/cm$^2$). See Table 1 for UV exposure times. Polymerization of SU-8 was conducted in the post-exposure bake at 65° C. for 1 minute and 95° C. for 3 minutes. The samples were developed in SU-8 developer to dissolve uncross-linked resist, for a period shorter than the time normally required to fully remove or wash away all of the uncrosslinked photoresist. This resulted in residual uncross-linked photoresist creating the hierarchical structure. Regarding the experimental parameters above, the shortened development time was 45 seconds. Then, the samples were immersed in isopropanol, in which a visible film was formed on the SU-8 structure. The residual isopropanol was washed away using de-ionized water. Finally, the sample was exposed without the photomask under a regular UV lamp for 30 seconds. An alternative would be to use sunlight, which also contains UV light. The fabrication steps with KMPR as the negative photoresist were the same, except that the spinning speed, exposure dose and baking time needed to be adjusted. FIG. 1 shows a schematic of the photolithography process for the fabrication of a superoleophobic surface.

Figure 3:
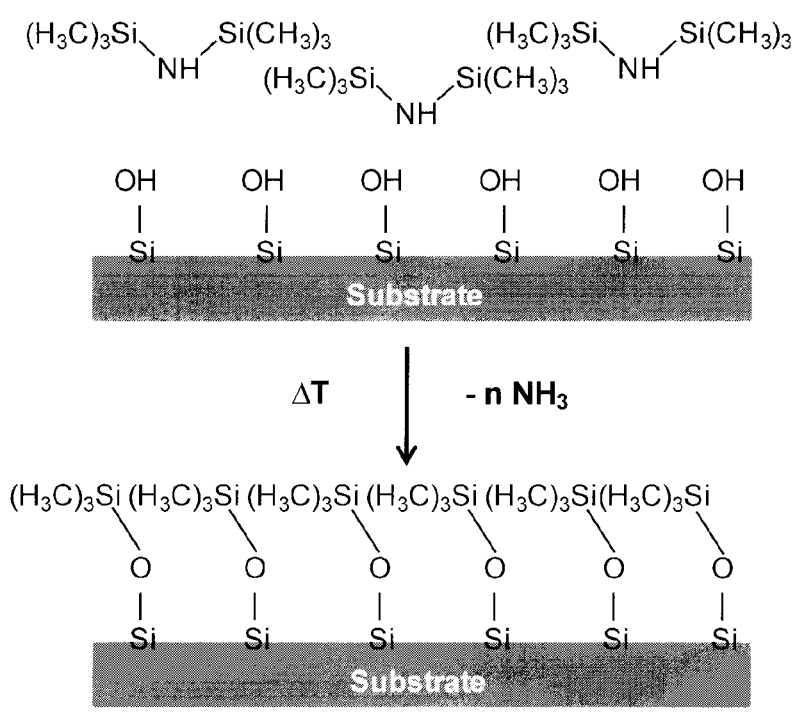
FIG. 3 shows a schematic of HMDS treatment of substrates for improved adhesion of photoresist to substrates.

The multiscale structures can be fabricated on a wide variety of different substrate materials using similar fabrication steps to those described above. Schematics of the process used with a variety of different substrates are shown in FIGS. 1, 2 and 9. The major process difference between different substrate materials is the UV exposure required, due to their diverse UV reflectivity and absorbance. For example, the rubber substrates require a higher UV dose as compared with the silicon (Si) wafers (see Table 1 for representative doses). The UV beams propagate through the photoresist layer to the substrate. Most of the beams are reflected by the Si substrate and pass through the photoresist again. In contrast, a large amount of UV energy is absorbed and fewer beams bounce back through the photoresist if the substrate is rubber. If the UV dose is too great, a size mismatch occurs between the pillar structure and its photomask pattern. Referring to FIG. 2, for polymer surfaces an ultrathin layer of flat photoresist is applied before building the actual structures to attenuate the UV absorption by the substrate. Due to the difference between surface adhesion and thermal conductivity, the spinning speed, baking time and developing time need to be adjusted according to the specific substrate. In addition, many materials easily oxidize, so long range hydrogen bonds form on the surface oxide with water adsorbed from the air. Once the resist is spun onto such a surface, it adheres to the water vapor rather than to the surface, resulting in poor adhesion. The substrates can be treated with HMDS (Hexamethyldisilazane) vapor (YES-3TA HMDS Oven) for increased adhesion of the photoresist (FIG. 3).

Chemical Modification of Surfaces

Figure 4:
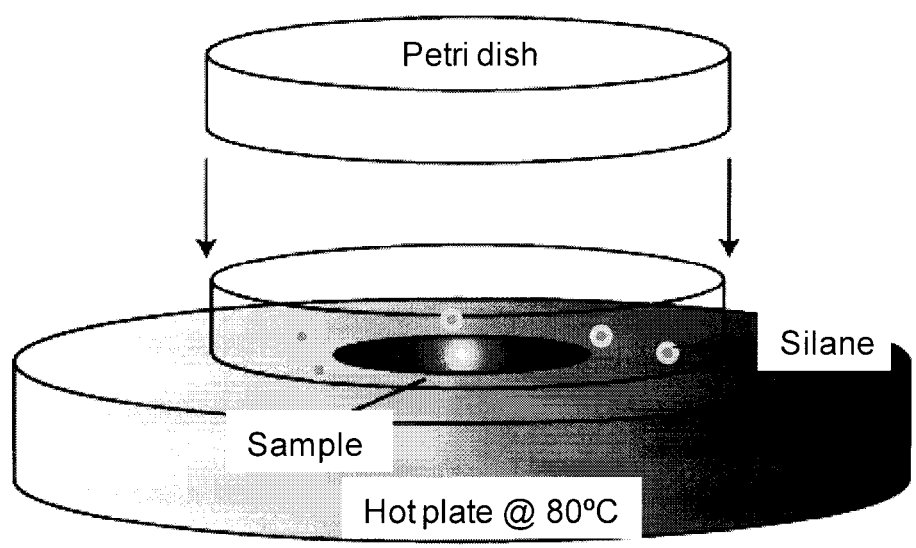
FIG. 4 shows a schematic of vaporized fluorosilane deposition.

Once the multiscale structure was built up on the substrate, the sample was fluorinated via vaporized 1H,1H,2H,2H-perfluoroctyl-trichlorosilane. Droplets of silane were applied around the sample in a covered Petri dish. Care was taken to avoid any direct contact of droplets with the samples. The Petri dish was baked at 80° C. on a hotplate to vaporize fluorosilane for 20 minutes. After that, the cover of the Petri dish was removed, leaving the samples to completely dry out at the room temperature (FIG. 4).

Results and Discussion

Surface Topography and Chemical Modification

Figure 5:
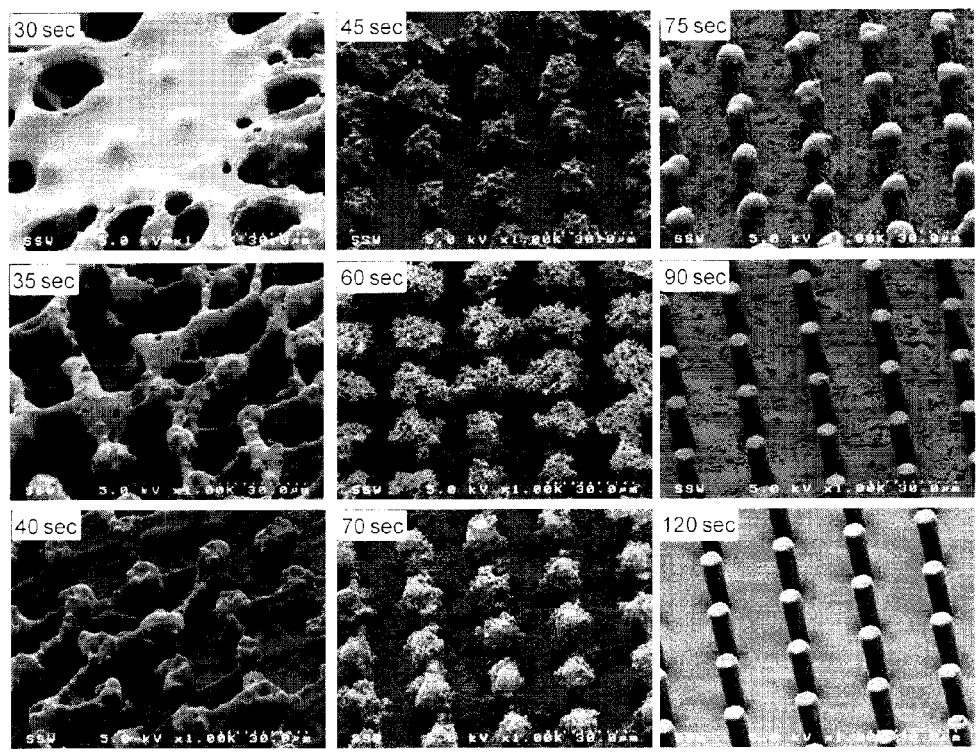
FIG. 5 shows SEM images of the development of the KMPR photoresist structure as a function of developing time.
Figure 6:
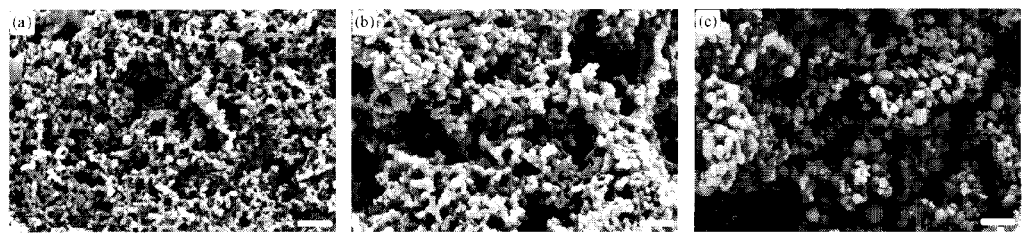
FIG. 6a shows nanoparticles with a photoresist (SU-8) developing time of 90 sec (scale bars in the figures stand for 1 μm)
FIG. 6b shows nanoparticles with a photoresist (SU-8) developing time of 60 sec (scale bars in the figures stand for 1 μm)
FIG. 6c shows nanoparticles with a photoresist (SU-8) developing time of 30 sec (scale bars in the figures stand for 1 μm)
Figure 7:
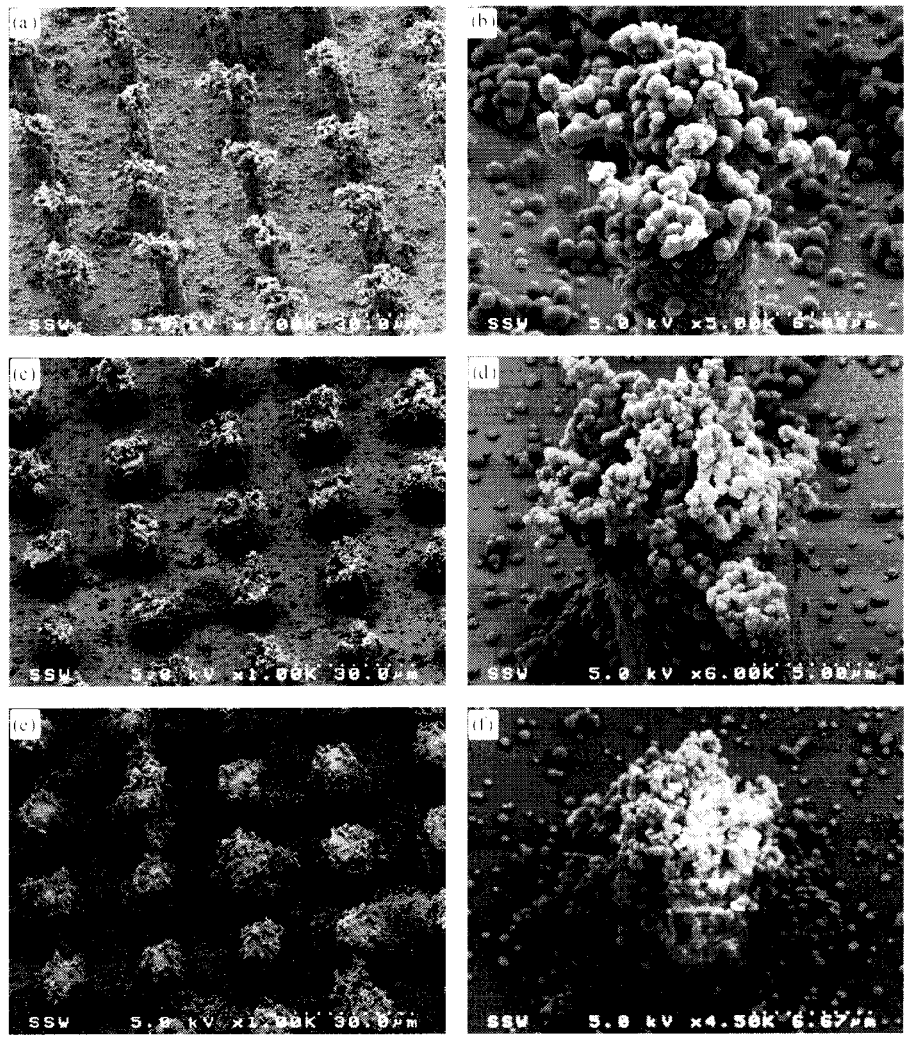
FIGS. 7a-b show SEM images of the modified surface of an Si wafer.
FIGS. 7c-d show SEM images of the modified surface of a black filled Butyl rubber.
FIGS. 7e-f show SEM images of the modified surface of a white filled Butyl rubber.

Photolithography using a negative photoresist is a robust method to fabricate micro-structures, which possesses stable chemical resistance, good thermal endurance for up to 200° C., and mechanical performance with Young's modulus 4-5 GPa (for SU-8). With the experimental parameters presented above, uniform photoresist micro-pillar arrays were fabricated on a Si wafer with a height of 20 μm (related to the resist coating speed and surface adhesion of substrates). The area fraction (f) of this superoleophobic surface was changed by varying the diameter of pillars from 7 μm to 15 μm, but keeping the center to center distance 25 μm. The nanoparticles were formed from un-crosslinked photoresist, SU-8 developer and isopropanol. Based on the liquid-liquid nucleation process, or so called Ouzo effect, a milky oil-in-water microemulsion forms when water is added to Ouzo (ethanol). In the present configuration, the negative photoresist, developer and isopropanol perform a similar function as the oil, ethanol and water in Ouzo, respectively. When mixing with isoproponal, the negative photoresist becomes greatly supersaturated, leading to the nucleation of photoresist droplets. Meanwhile, the photoresist immediately begins migrating to the adjacent droplet, so that the supersaturation decreases and no further nucleation occurs. In the conventional photolithography process, the uncrosslinked photoresist is dissolved in SU-8 developer, leaving the crosslinked structure, which is the pillar array in our design. However, the present process employs a shorter pre-determined developing time (under-developed), so that a small amount of un-crosslinked photoresist remains on the surface of the pillar array. Once this sample is dipped in isopropanol, the un-crosslinked photoresist is shaped into spherical nanoparticles. Since the micropillars are hydrophobic, these nanoparticles mostly congregate around the top of pillars instead of filling the gap between pillars, so that a re-entrant structure is formed by these clustered convex nanoparticles. The development of the photoresist (SU-8 or KMPR) nanoparticle structure as a function of developing time is demonstrated in FIG. 5. The size of the nanoparticles is adjustable by changing the developing time. The shorter the developing time, the larger the particle size produced (FIG. 6a-6c). The control of the nanoparticles size may help to further improve the superoleophobicity. Therefore, the re-entrant structure over pillars can be easily manipulated for maximum superoleophobic performance.

In addition, the negative photoresist intrinsically possesses high surface adhesion to various substrates, thus the micropillars are very stable and well attached to the base. The bonding between micropillars and nanoparticles is also very strong, as the nanoparticles are also made of negative photoresist and are crosslinked to the pillars. The textured surfaces made on Si wafer, white filled and black filled butyl rubbers are shown in FIG. 7a-7f.

Fluorination of the artificial structure was carried out under regular laboratory conditions without the elimination of oxygen and moisture in order to simplify the fabrication process. Fluorination lowers the surface energy by increasing the concentration of —$CF_3$ chemical groups at the surface. Even though for all oils on all flat surfaces, $\theta_{flat}<90°$, one generally wants to increase the intrinsic contact angle (CA) as much as possible. A smaller degree of reentrancy is needed the closer the CA is to 90 degrees. Thus, the energetic difference between metastable (superoleophobic) and stable (complete wetting) states should be smaller. It is also expected that lower surface energies will provide higher barriers for transition from Cassie-Baxter to Wentzel states, leading to increased robustness. Since the fluorocarbon groups (especially —$CF_3$) are known to possess low surface energies, rough surfaces should benefit from being fluorinated.

Super-Hydro/Oleo-Phobicity

Figure 8:
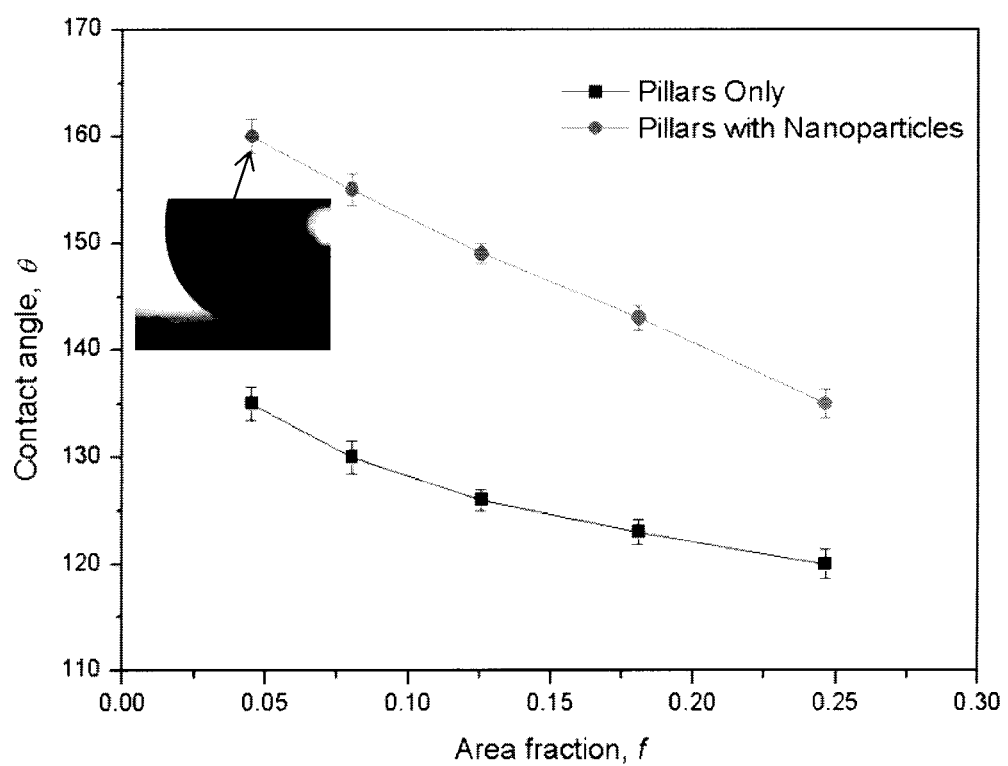
FIG. 8 shows the contact angles vs. area fractions of pillars with nanoparticles and "bare" pillars; and, FIG. 9 shows a schematic of a photolithography process for the fabrication of micro-/nano-scale hierarchical structures on metallic surfaces.

The contact angle for these surfaces with water is always nearly 180°, while the results for hexadecane changed with f of pillar tops (relatively to the total surface area). As shown in FIG. 8 (red line and circular knob), the contact angle for hexadecane was only 135° when f was 0.25. The surface exhibits higher oil repellency at lower values of f (160° for f around 0.05). This tendency corresponds to the Cassie-Baxter equation for heterogeneous wetting:

$$\cos \theta_{rough} = f \cos \theta_{flat} - (1-f), \quad (3)$$

where f is the area fraction of solid surface which is in contact with the liquid, $\theta_{rough}$ and $\theta_{flat}$ are the contact angles for the rough surface and flat surface, respectively. Therefore, the contact angle with hexadecane reached 160° (and with methanol was 120°) by minimizing the area fraction. The droplets easily rolled off the surface, indicating a small contact hysteresis. Although SU-8 itself is hydrophobic, hexadecane easily wetted the flat SU-8 surface. Surfaces only patterned with micro-scale pillars had a lower repellency to oil than surfaces comprising both micropillars and nanoparticles (FIG. 8, black line and squares). These controlled experiments illustrate the importance of area fraction to the superoleophobicity of the surface. The properties of different substrates are shown in Table 1.

TABLE 1

Properties of different substrates.

| Substrate | Photoresist | UV exposure (Seconds) | Static contact angle (Hexadecane) | Static contact angle (Methanol) | Tape test (until hexadecane droplet cannot roll off) |
|---|---|---|---|---|---|
| Silicon | SU-8 | 33 | 160 ± 0.6° | 120 ± 0.8° | Average 7 times (Scotch tape) |
| Black-filled IIR | SU-8 | 60 | 158 ± 0.8° | N/A | Average 5 times (Nichiban tape) |
| White-filled IIR | SU-8 | 60 | 157 ± 0.6° | N/A | Average 5 times (Nichiban tape) |
| Gold | SU-8 | 30 | 156 ± 0.6° | N/A | N/A |
| Aluminum | SU-8 | 30 | 157 ± 0.8° | N/A | N/A |
| Silicon substrate | KMPR | 50 | 163 ± 0.6° | N/A | N/A |

Discussion

It has been shown in the above examples that multiscale roughness features ranging from hundreds of microns for pillars in combination with those in the range of tens of nanometers for particles are important to produce superoleophobic coatings. The reason for this is two-fold. Firstly, such multiscale roughness can make the surface very "airy", and thus decrease the effective liquid-solid contact area fraction f in Eq. (3). Secondly, it is important to produce a re-entrant and convex morphology.

Prior art microscale surfaces share one significant drawback—they only have one re-entrant feature per valley. This means that if the surface has a defect or local disturbance on one of the re-entrant features, a liquid drop will most-likely wet the local valley. By contrast, the present surfaces are more robust because there are many re-entrant features associated with each valley. This greatly improves the probability that a liquid drop will not wet the present surfaces.

In summary, a re-entrant surface curvature (nanoparticles), in conjunction with roughened texture (micropillars) can be used to design surfaces that display extreme resistance to wetting from a number of liquids with low surface tension, including hexadecane and methanol. SU-8 and KMPR are simply examples of negative photoresists; it is probable that other types of negative photoresist can also be used in the fabrication of these superoleophobic surfaces.

Disclosed herein is a simple and fast fabrication method to produce superoleophobic surfaces using only photolithography and a simple fluorosilane vapor deposition technique. The multiscale morphology of such superoleophobic surfaces combines both micro-scale regular pattern (pillars) as well as nano-scale roughness (via assemblies of nanoparticles). This method can be applied to various kinds of substrates materials including silicon wafers, glass wafers, metal sheets and thin rubber films. The resulting superoleophobic surfaces are robust and stable. Furthermore, the fabrication technique disclosed herein is simple and low-cost as compared with many other methods, and thus suitable for practical applications.

The invention claimed is:

1. An article comprising a substrate, the substrate having a surface comprising a pattern of microscale pillars topped with a plurality of nanoparticles, wherein:
   the plurality of nanoparticles together create a re-entrant convex morphology atop each pillar, and
   the surface has a contact angle for water of greater than 150°.

2. The article of claim 1, wherein the pattern comprises an array.

3. The article of claim 2, wherein the surface also has a contact angle for hexadecane of greater than 150°.

4. The article of claim 3, wherein the nanoparticles comprise a negative photoresist.

5. The article of claim 4, wherein the surface has a multi-scale morphology.

6. The article of claim 1, wherein area fraction, f, of the surface is from 0.01 to 0.10.

7. The article of claim 6, wherein the surface comprises a fluorinated hydrocarbon.

8. The article of claim 7, wherein the surface comprises a fluorosilane material.

9. The article of claim 8, wherein the microscale pillars comprise a negative photoresist.

10. The article of claim 9, wherein both the pillars and the nanoparticles comprise the negative photoresist.

11. The article of claim 10, where the substrate comprises silicon, glass, metal or a polymer.

12. The article of claim 11, wherein the substrate is applied to the article.

13. The article of claim 11, wherein the polymer comprises an elastomer.

14. The article of claim 13, wherein the elastomer comprises butyl rubber.

* * * * *